(12) United States Patent
López-Hernández et al.

(10) Patent No.: US 6,867,929 B2
(45) Date of Patent: Mar. 15, 2005

(54) LIGHT SOURCE DEVICE

(75) Inventors: Francisco-José López-Hernández, Madrid (ES); Juan-Carlos Miñano-Dominguez, Madrid (ES); Pablo Benitez-Giménez, Madrid (ES); Masahisa Sakai, Kanagawa (JP); Kazutoshi Hirohashi, Kanagawa (JP)

(73) Assignees: Universidad Politecnica de Madrid, Madrid (ES); Victor Company of Japan, Limited, Yokohama (JP)

( * ) Notice: Subject to any disclaimer, the term of this patent is extended or adjusted under 35 U.S.C. 154(b) by 0 days.

(21) Appl. No.: 10/143,923

(22) Filed: May 14, 2002

(65) Prior Publication Data

US 2003/0026002 A1 Feb. 6, 2003

(30) Foreign Application Priority Data

May 18, 2001 (JP) ........................ 2001-150178

(51) Int. Cl.[7] ................. G02B 17/00; G02B 27/30; G02B 13/20; G01J 1/00
(52) U.S. Cl. ................ 359/726; 359/641; 359/707; 250/503.1
(58) Field of Search ................. 359/641, 599, 359/707, 754–756, 726–727; 250/493.1, 503.1; 398/106, 118; 372/9, 23

(56) References Cited

U.S. PATENT DOCUMENTS

| | | | | |
|---|---|---|---|---|
| 3,782,804 A | * | 1/1974 | Kanazawa et al. | 359/29 |
| 4,155,630 A | * | 5/1979 | Ih | 359/707 |
| 4,453,806 A | * | 6/1984 | Wick | 359/707 |
| 5,309,339 A | * | 5/1994 | Webb | 362/259 |
| 5,481,385 A | * | 1/1996 | Zimmerman et al. | 349/62 |
| 5,982,563 A | * | 11/1999 | Nakamura et al. | 359/727 |
| 6,416,181 B1 | * | 7/2002 | Kessler et al. | 353/7 |
| 6,538,251 B1 | * | 3/2003 | Weckstrom et al. | 250/343 |
| 6,594,090 B2 | * | 7/2003 | Kruschwitz et al. | 359/707 |
| 6,639,733 B2 | * | 10/2003 | Minano et al. | 359/728 |

* cited by examiner

*Primary Examiner*—Jordan M. Schwartz
(74) *Attorney, Agent, or Firm*—Clark & Brody

(57) ABSTRACT

The present invention provides a light source device that is safe for human eyes and whose switching is performed at high speed. The light source device comprises one or more laser light sources (1) for emitting a monochromatic or polychromatic light beam, a diffuser (3), which may be transmissive, reflective, or a mixture thereof, for diffusing the light beam received directly from the laser light source or via an optical focusing system (2), and an optical collimator (4), which collimates the diffused light bundle emitted from the diffuser (3).

4 Claims, 7 Drawing Sheets

LIGHT SOURCE DEVICE

BACKGROUND OF THE INVENTION

1. Field of the Invention

The present invention relates to a light source device in which a laser diode is employed as a light source and used for a wireless optical communication.

2. Description of the Related Art

In recent years, there has been growing interest in wireless optical communications. There are several reasons for this as follows: the electromagnetic spectrum they use is not covered by current legislation, they are reliable systems, and they are not expensive. Moreover the possibility of an information leakage to the external due to rectilinear propagation property of the light is low and secrecy is high. The most widespread example of this type of communications can be found in the great majority of remote controls for electronic consumer goods. In this case the communication is usually unidirectional and very low-speed. Among the disadvantages of this type of device, the most important are the need for a visual link without obstacles and the limitation of the level of exposure to which the human eye can be subjected, which restricts the power and collimation characteristics of the bundle. This limitation has obliged the majority of these devices to use as radiation source an LED (Light Emitting Diode) or IRED (Infra Red Light Emitting Diode) instead of an LD (laser diode). The use of LEDs or IREDs has restricted in practice not only the irradiance (power per unit of area) of the bundle transmitted, but also the transmission speed, since the switching time of these devices (in the order of a few nanoseconds) is comparatively long if they generate radiant power of around tens of milliwatts or more, which is generally necessary for wireless optical communications. To these LEDs and IREDs diode, a laser diode is obviously advantageous with respect to switching time and generating radiant power, and is also advantageous in cost because it is popular as a device for optical discs such as MD, CD. Its only disadvantage is that it is necessary to modify the characteristics of the bundle (for example, in general, it is necessary to reduce the irradiance of the bundle) if there exists the possibility of its reaching the eyes, which is the case in most applications of wireless communications and illumination. The maximum permissible exposure level where this possibility exists is laid down in the European CENELEC EN 60825-1 (CEI 825-1:1993), CENELEC EN 60825-2 (CEI 825-2:1993), JISC6802:1997 and IEC60825-2:1993 standards relating to "Safety of laser products". Maximum permissible exposure levels depend on several factors, important among which are radiation wavelength, duration and frequency of light pulses and type of source, extended or collimated.

In order to achieve that the irradiance is within the limits, it is always possible to use the solution of attenuating the bundle by means of an appropriate filter. However, this produces very high optical losses. There is also the possibility of reducing the irradiance and, moreover, taking advantage of this reduction to increase the cross-sectional size of the bundle or expand its angular divergence, or both, without causing high optical losses. When the bundle is expanded, its irradiance necessarily decreases, thus achieving the objective; furthermore, the power transmitted in the far field axial direction of the bundle can be increased.

Nevertheless, if this expansion is carried out by means of a conventional optical system, that is, through a combination of lenses and mirrors, the laser system is not eye-safe. This is due to the fact that viewing the bundle through optical instruments such as binoculars or telescopes is unsafe, since such instruments accomplish the inverse process to that of the expansion of the bundle, that is, they concentrate the laser bundle on the eyes, so that permitted exposure levels may be exceeded. Furthermore, this procedure for expanding the bundle reduces angular divergence, which is a disadvantage in those applications in which a wide pointing error tolerance is required.

Irradiance can also be reduced by means of diffusers. Diffusers achieve an increase in the angular divergence of the bundle without modifying the cross-section the bundle has when it reaches the diffuser. Obviously, mean radiance (power per unit of surface and unit of solid angle) of the bundle decreases, since the conservation of energy must be fulfilled. Where there is diffusion, the mean irradiance of the bundle decreases more rapidly with distance from the point of diffusion, since angular divergence is bigger than the one of the non-diffusion case. In this way it is possible to fulfil the requirements of CENELEC EN 60825-1(CEI825-1:1993), JISC6802:1997 and IEC60825-1:1993 with effect from a short distance away from the point of emission. Moreover, this solution reduces the problem of the possible viewing of the bundle with binoculars or telescopes, since, on reducing the mean radiance of the bundle, the maximum irradiance that can be achieved with such optical instruments is limited. This fact is related to loss of (spatial) coherence of the laser bundle after diffusion. These diffusers can be made in various ways. For example, a transmissive diffuser can be made with sheets of transparent material, one of whose surfaces is matt, that is, one of whose surfaces is such that the direction of the normal to the surface on which the refraction occurs can be considered as a random variable. From the probability distribution function of this normal and the distribution of radiant intensity of the laser bundle, it is possible to calculate the radiation intensity distribution after the diffusion. A more precise calculation would require the consideration of Fresnel reflections, which contribute to greater diffusion. If the irregularities are of the order of the wavelength, than it is necessary to use the wave optics theory to obtain the intensity distribution on the diffuser exit. This is the case of another type of diffuser that is made using holograms.

Reflection diffusers constitute a second type. A reflection diffuser can be achieved simply by using matte paint. The laser radiation impinges on the reflector with a small angular divergence and is reflected with a large angular divergence. A good diffusive reflector, such as those used as the inner coating of integrating spheres, produces a reflected intensity with a Lambertian pattern, that is, the reflector emits isotropically in the hemisphere it is facing.

The main problem of diffusers is that the only way to reduce irradiance is through expansion of the angular divergence, and this means that the divergence of the bundle is determined by the safety criteria. These are such that the irradiance achieved at a distance of 10 cm from the point of diffusion must be below the maximum permissible (10 cm is the minimum distance established by the regulations CENELEC EN 60825-1 (CEI825-1:1993), JISC6802:1997 and IEC60825-1:1993). If, in order to achieve this objective, it has been necessary to reduce the irradiance by a factor $1/C$ ($C>1$), then, and given that angular divergence does not vary, the reduction of irradiance at a distance D will be $C = D^2/(10 \text{ cm})^2$. This result is approximately correct when the divergence of the bundle is much greater than the solid angle subtended by the illuminated area of the diffuser at a distance of 10 cm, which is the case if the irradiance of the laser bundle has to be reduced. In this way, the transportation of light through the air involves high propagation losses, and this solution becomes useful only for small distances.

Diffusers have a second problem: Given the random nature of the principle of diffusion, intensity distributions, as a function of direction of emission, present gentle variations, and their form is not totally controllable (in the case of diffusers based on rough surfaces, these distributions tend to be Gaussian). In general, the desired type of intensity distribution is one that fulfils the eye-safety criteria within a given angular field of emission, and that emits nothing outside of it (so as not to lose laser power). This type of sharp distribution cannot be achieved with diffusers, which necessarily emit some power outside of the design angular field and, moreover, cannot maintain a constant intensity within that field. The overall result is a loss of transmission efficiency of the laser radiation.

SUMMARY OF THE INVENTION

The present invention is proposed in consideration of the above-described circumstances, and an object of the present invention is to provide a light source device such that the divergent angle and width of the light bundle are controlled, and the monochromatic or polychromatic incoherent light bundle having a short switching time is emitted.

To solve the above-described problem, a light source device of the present invention comprising a laser light source, a diffuser for diffusing a light emitted from the laser light source, and a collimator for collimating a light diffused by the diffuser and emitting it.

Specifically, a light source device of the present invention comprising one or more laser diodes which are laser light sources, one or more diffusers, a collimation optical system for collimating a light emitted from one or more diffusers. The collimator optical system is referred to as a collimator. The diffuser may be any one of a transmissive diffuser through which laser bundle transmits and are diffused, a reflective diffuser on which laser bundle is reflected and diffused, or a mixture diffuser which combines these diffusers. A reflective diffuser is simply a reflector whose diffuse reflection coefficient is higher than its mirror surface reflection coefficient. A laser bundle is emitted toward the diffuser. A light source device may have an optical focusing system for making the diffuser focusing the laser bundle. Using an optical focusing system, control of distribution of irradiance on the diffuser is easily performed. After the laser bundle is diffused by the diffuser, the laser bundle is collimated by the collimator. Usually, the diffuser is disposed on the focal plane. In this case, the intensity distribution of the entire device is determined by the distribution of irradiance in the diffuser. Therefore, the shape and value of intensity distribution of the light source device can be controlled by appropriately designing the optical focusing system of the laser bundle. Moreover, outgoing angle of view can be controlled by employing a diaphragm which limits illuminated area in the diffuser, or by limiting a diffuser area.

DESCRIPTION OF THE PREFERRED EMBODIMENTS

Hereinafter, a light source device of embodiments of the present invention will be described with reference to the drawings.

The present invention is a light source device comprising a laser light source for emitting monochromatic light or polychromatic light, a diffuser for diffusing the light bundle emitted from the laser light source and a collimated optical system referred to as a collimator which collimates the light bundle emitted from the diffuser, which is safe for human eyes and whose switching is performed at high speed. As a diffuser, a transmissive diffuser, a reflective diffuser, or a mixture diffuser which combines the transmissive diffuser and the reflective diffuser can be used, a laser light source directly emits the light bundle toward the diffuser, or injects the light bundle into the diffuser via the optical focusing system.

Figure 1:
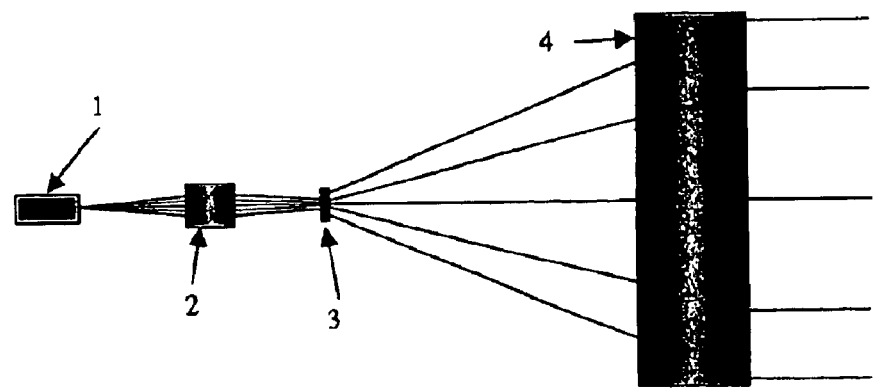
FIG. 1 is a schematic diagram of the light source device.

FIG. 1 is a schematic view showing a light source device applying the present invention.

The light source device comprising a laser light source 1 for emitting a laser bundle, an optical focusing system 2 for focusing the light bundle injected from the laser light source 1, a transmissive diffuser 3 for diffusing the light bundle focused by the optical focusing system 2, and a collimated optical system 4, that is, a collimator for collimating the light bundle diffused by the diffuser 3.

Figure 2:
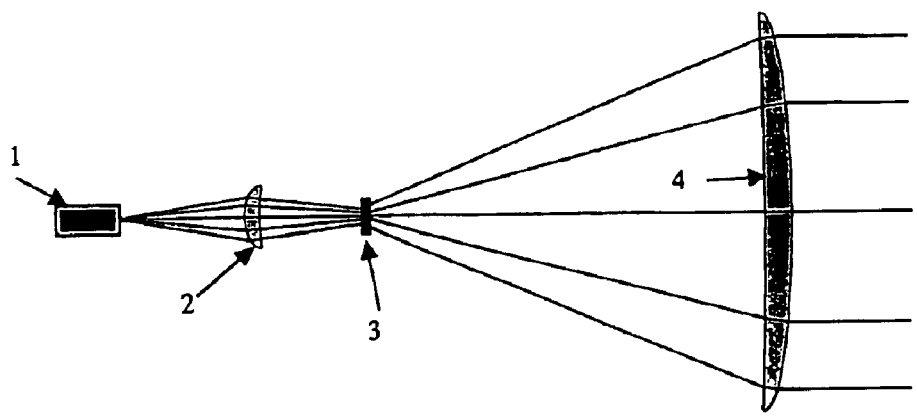
FIG. 2 is a diagram of an example of the light source device.

FIG. 2 is a diagram showing a concrete example of a light source device applying the present invention.

This light source device comprising the laser light source 1, the optical focusing system 2 consisted of a single lens, the transmissive diffuser 3 and the collimation optical system 4 consisted of a signal lens.

It is not always necessary to employ an optical focusing system for collimating the laser bundle. This is because it is possible to adjust the distance from the laser light source to the diffuser in such a way that the illuminated area of the diffuser is precisely required by the collimator.

Figure 3:
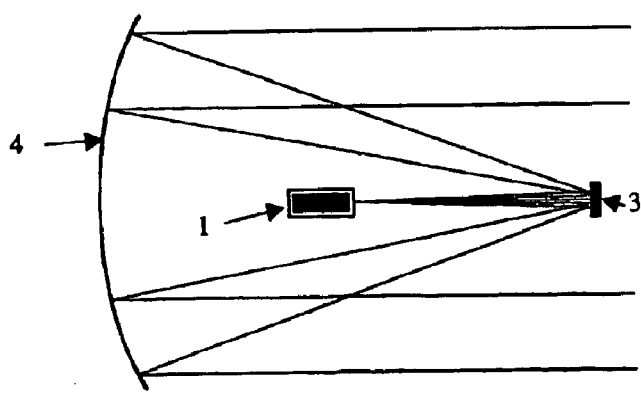
FIG. 3 is a diagram of another example of the light source device without optical focusing system.

FIG. 3 is a diagram showing a concrete example of a light source device which does not have an optical focusing system.

This light source device comprising the laser light source 1, the reflective diffuser 3, and the collimated optical system 4 consisted of a parabolic mirror. In this light source device, the laser bundle emitted the laser light source 1 directly injects into the reflective diffuser 3 without going through the optical focusing system.

The diffuser does not necessarily have to be a plane perpendicular to the central direction of the laser bundle. In fact, when the diffuser is on a flat surface whose normal forms any angle with the central direction of the incident laser bundle it is possible to correct the astigmatism common to many semiconductor lasers.

The diffusers that are easiest to make, and consequently the least expensive, are Lambertian or quasi-Lambertian diffusers. The radiation impinging at a point of a diffuser of this type is diffused isotropically on one of the two hemispheres defined by the plane tangent to the diffuser at that point. If the diffuser works by reflection, then the radiation is diffused on the hemisphere that contains the direction of incidence on the diffuser. If the diffuser works by transmission, then the radiation is diffused on the other hemisphere. In general, it is difficult to achieve a highly efficient transmissive diffuser, since part of the radiation diffused is reflected. An efficient reflection diffuser is easier to achieve. For these cases it is very useful to employ as collimators the optical systems described in "Method of Design and Apparatus Derived From Method for Ultra Compact, High Efficiency, Optical Non-imaging Concentrators, Collimators and Couplers"—Provisional Patent Application (PPA) No. 60/190,130 filed with the U.S. patent and Trademark Office (USPTO) on Mar. 16, 2000. These optical systems are highly efficient for collimating isotropic radiation, which is the case in question when the diffuser is Lambertian. Moreover, they are very simple and compact.

Figure 4:
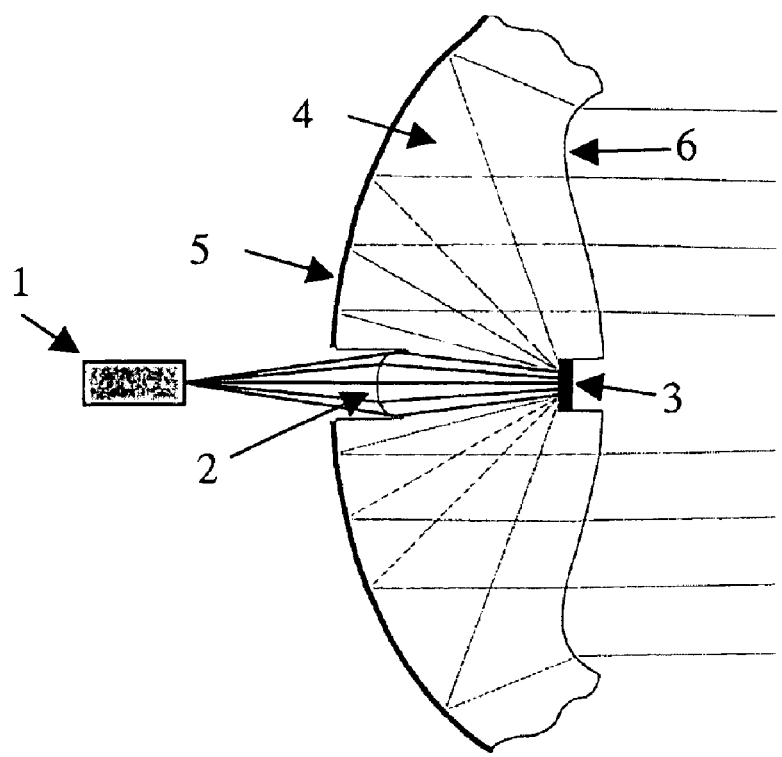
FIG. 4 is a diagram of another example of the light source device using one of the collimators described in U.S. provisional patent application No. 60/190,130.

FIG. 4 is a diagram showing a concrete example of a light source device employing one collimator according to the above-described U.S. Provisional Patent Application No. 60/190, 130.

This collimator is called the RX. The device of FIG. 4 consists of the laser bundle emitter 1, the optical focusing system 2, formed in this case of a single lens, a reflection diffuser 3, and finally, the RX 4, which constitutes the optical system of collimation. The RX 4 is formed of a single solid piece with a reflective surface 5 and a refractive surface 6. The radiation diffused by 3 is reflected by 5 and refracted by 6, so that it exits collimated. In the example of FIG. 4, the optical focusing system 2 is incorporated in the collimator 4, so that the diffuser, the optical focusing systems and the optical systems of collimation form a single solid piece. In this example it can also be seen that the solid piece has some of its surfaces coated with a specular reflector and the diffuser is attached to another of the surfaces.

Figure 5:
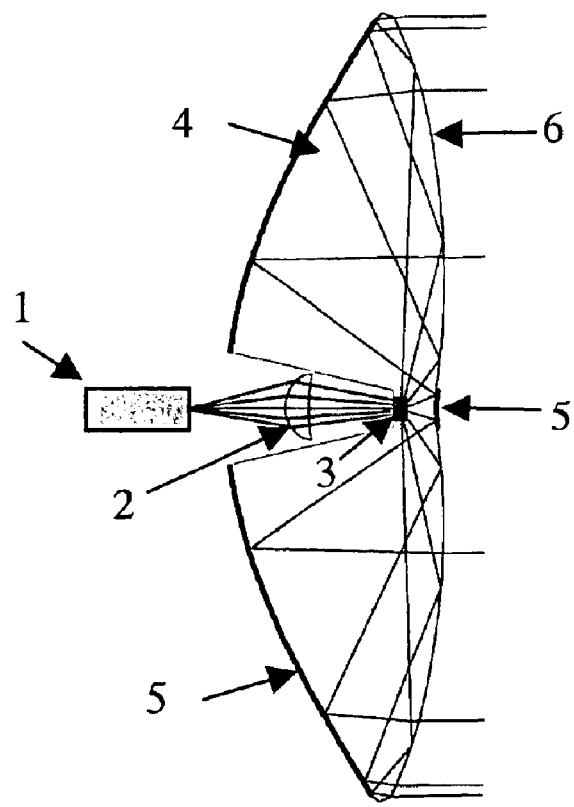
FIG. 5 is a diagram of another example of the light source device using the so-called RXI collimator described in U.S. provisional patent application No. 60/190,130.

FIG. 5 is a diagram showing a concrete example of a light source device employing the RXI collimator according to the above-described U.S. Provisional Patent Application No. 60/190, 130.

This light source device comprising the laser light source 1, the optical focusing system 2 consisted of a single lens, the transimissive diffuser 3 and the RXI 4 constituting the collimation optical system. The RXI is formed of a single solid piece with a reflective surface 5 in the rear part, as well as a small specular reflective area at the front, and a refractive surface 6 that also acts as a reflector through internal reflection. The radiation diffused by 3 is reflected by the frontal part of 5 and by the surface 6, which now acts as a reflector by internal reflection. After this reflection the radiation is reflected by the rear part of 5 and refracted by 6, so that it exits collimated. In the example of FIG. 5, the diffuser and the optical system of collimation form a single solid piece. Also in this example it can be seen that the solid piece has some of its surfaces coated with a specular reflector and the diffuser is attracted to another of the surfaces.

Figure 6:
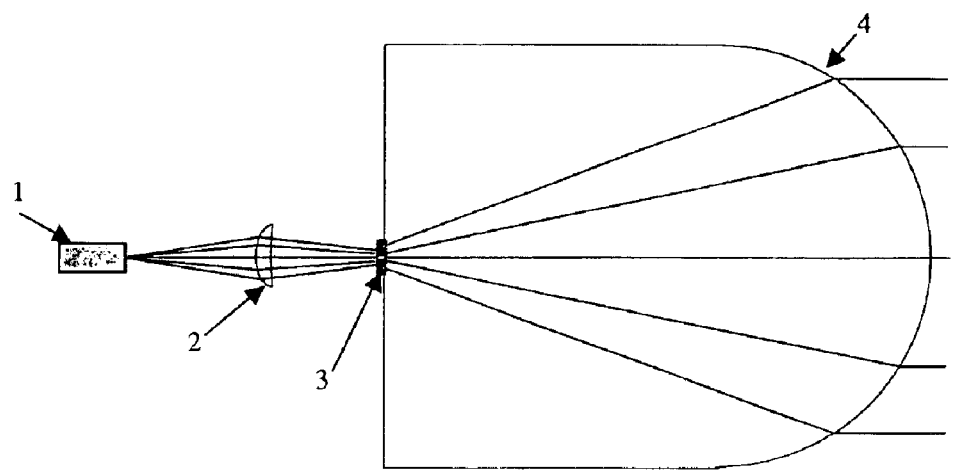
FIG. 6 is a diagram of another example of the light source device in which the collimator and the diffuser form a single—solid piece.

FIG. 6 is a diagram showing a concrete example of a light source device constituting a single constructed body that is configured by the diffuser and the collimation optical system.

This light source device comprising the laser light source 1, the optical focusing system 2 consisted of a single lens, the transmissive diffuser 3, and the RXI 4 constituting the collimation optical system.

By way of an example, suppose that it is desired to effect a communication link at wavelength $\lambda=780$ mm with a Class 1 security level. This is the maximum-security level, which guarantees that the laser product is safe in all reasonably foreseeable conditions of use. For this link it is estimated that time of exposure to a human eye may reach the maximum allowed for in the regulations CENELEC EN 60825-1 (CEI 825-1:1993), JISC6802:1997 and IEC60825-1:1993(t=30000s), and the emitter is required to have an angular divergence of $\theta=60$ mrad.

It is aimed to compare the maximum permissible power on exit from the emitter in the following two cases: (1) if the emitter consists simply of a laser and a conventional lens for adjusting its divergence to the specified value $\theta$, (2) if the emitter of FIG. 4 is used, with an exit aperture diameter of 20 mm and a Lambertian diffuser. In order to make the comparison, it is supposed that both produce a far field diagram of Gaussian intensity with rotation symmetry, with angular divergence $\theta=60$ mrad as defined in the regulations CENELEC EN 60825-1(CEI 825-1:1993), JISC6802:1997 and IEC60825-1:1993: a cone centered on the emitter that subtends a complete angle of e=60 mrad encloses 63% of the far field power radiated by the emitter.

Regulations CENELEC EN 60825-1(CEI 825-1:1993), JISC6802:1997 and IEC60825-1:1993 establish not only the maximum safe exposure level, but also the measurement conditions of this exposure level. For Class 1 safety level, t=30000 s and $\lambda=780$ nm, the power measurement should be taken at a distance r=10 cm from the emitter. Both the size of the sensor that measures this power and the maximum value of this power (called Accessible Emission Limit, or AEL) depend on the angular size of the source, $\alpha$, at a distance r=10 cm from the emitter. This angular size of the source coincides with its angular divergence e in the emitter of case (2), whilst for the emitter in case (1), assuming the Gaussian laser bundle, it is given by the angular size that produces maximum narrowing of the bundle at that distance. Using the basic relationship between the divergence and maximum narrowing of the Gaussian bundle, we obtain:

$$\alpha(emitter1) = 2\tan^{-1}\left(\frac{\lambda}{\pi r\theta}\right) = 41.3 \text{ }\mu\text{rad} \quad (1)$$

$$\alpha(emitter2) = \theta = 60 \text{ mrad}$$

According to regulations CENELEC EN 60825-11(CEI 825-1:1993), JISC6802:1997 and IEC60825-1:1993, sources with values of $\alpha<1.5$ mrad (which includes the case of emitter 1) are equivalent from the point of view of safety for all exposure conditions. This is due to the combined effect of the resolution of the human eye and its unconscious natural movements (which prevent the point of focus on the retina from remaining stationary).

The maximum power values to be measured in the conditions indicated by the regulations are given by:

$$AEL=1.2*10^{-4}*C_4*C_6(W) \quad (2)$$

where $$C_4=10^{0.002\times(\lambda(nm)-780)}=1.445 \quad (3)$$

and $$C_6(emitter1) = 1 \quad (4)$$

$$C_6(emitter2) = \frac{\alpha \text{ (mrad)}}{11 \text{ mrad}} = \frac{60}{11} = 5.455$$

Therefore:

$$AEL(emitter1)=173.4 \text{ }\mu W$$

$$AEL(emitter2)=945.9 \text{ }\mu W \quad (5)$$

In accordance with modifications to the regulations CENELEC EN 60825-1/A11:1996, JISC6802:1997 and IEC60825-1 Amendament1: 1997, the measurement should be carried out in each case with a sensor of the following diameter d:

$$d(emitter1) = 50 \text{ mm} \quad (6)$$

$$d(emitter2) = (7 \text{ mm})\sqrt{\frac{100}{\alpha \text{ (mrad)} + 0.46}} = 9 \text{ mm}$$

All of the power emitted by emitter 1 is collected by the sensor (since at r=10 cm, width of the divergent bundle with $\theta$=60 mrad is around 3 mm). Emitter 2 verifies that the irradiance it produces at any point of its exit aperture is constant and equal to that received by the sensor situated at r=10 cm. Taking this into account, together with equations (5) and (6), it is obtained that the power emitted by emitters 1 and 2 is limited by the values:

$$P_{OUT}<173.4 \text{ }\mu W \text{ (emitter1)}$$

$$P_{OUT}<4.67 \text{ mW (emitter2)} \quad (7)$$

As it can be seen in equation (7), the emitter proposed in this patent (emitter 2) permits, in this example, working with Class 1 safety level with powers 27 times higher than a conventional emitter (emitter 1) of equal angular divergence and safety level.

In general, it is required that the intensity (power radiated per unit of solid angle) emitted by the collimator is the maximum permissible within a given angular region. The reason for this is that if for any direction within the angular region of interest that intensity is lower than the permitted maximum, then in that direction there is less emission, but with no increase in safety for the human eye. When the diffuser is situated in the focal plane of the collimator, the requirement that the intensity emitted by the collimator is constant within an angular region is equivalent to requiring that the irradiance produced by the laser beam on the diffuser (through the focusing optical system) is also constant for a given area of the focal plane.

In order to achieve an approximately constant irradiance on the diffuser surface, conventional optics components can be used. In general, semiconductor lasers have a radiation diagram that varies greatly from one unit to another. This hinders enormously the design of an optical focusing system valid for all units, if what is required is that this focusing system produces a constant irradiance and that it is efficient from the energy point of view. That is, if in addition to the constant irradiance on the diffuser it is required that a large proportion of the power emitted by the laser is that which illuminates the diffuser with constant irradiance. If uniformity of the irradiance is more important than energy efficiency, then it is advantageous to use polyhedral lenses. These are lenses which have one ore more refractive surfaces with a polyhedral shape.

Polyhedral lenses have the advantage of being able to provide an almost uniform irradiance on the diffuser surface, regardless of the radiation diagram. It is sufficient for any point of the lens to be at a large distance from any point of the area of the diffuser in which it is required to achieve uniform irradiance and that the irradiance produced by the laser bundle does not vary greatly within the points of a single face of the polyhedral surface. In order to know when the distance is sufficiently large or when the irradiance varies little within a face of the polyhedron, it is necessary to know how uniform the irradiance on the diffuser must be. The polyhedral lens can be satisfactorily used with laser diodes whose radiation diagram is widely dispersed in the manufacturing process. There follows a description of how to design one of these polyhedral lenses. The same basic procedure can be followed to design polyhedral mirrors.

First of all, it is necessary to identify the area of the diffuser in which it is required to obtain uniform irradiance. This area will be referred to as the active area of the diffuser. Choose a central point of this area as the central point of the diffuser.

Next, select the distance D between the waist of the laser bundle (point 7) and the central point of the diffuser (point 8). High values of D produce greater uniformity of irradiance, though, in general, they imply greater size.

Subsequently, design a Cartesian oval that focuses point 7 on point 8. The design of the Cartesian oval is simple: it is sufficient to establish that the optical path between point 7 and point 8 is constant for the rays that are refracted (reflected for mirrors) on the surface of the Cartesian oval. If x, y, z are the coordinates of a point of the oval, the equation of the surface of the oval is $$L_1(x,y,z)+L_2(x,y,z)=L \quad (8)$$

Where L1 (x,y,z) is the optical path between point 7 and the point of the oval given by the coordinates (x,y,z) and L2 (x,y,z) is the optical path between the point of the oval given by the coordinates (x,y,z) and point 8. L is a constant that establishes the total optical path between A and B. The value of L is selected at the beginning of the procedure. Different values of L will permit greater or les ser uniformity of illumination in the plane of the diffuser, since they will give rise to lenses (or mirrors) more or less separated from the diffuser or from the laser. In a Cartesian oval of refraction not the entire surface defined by equation (8) is Cartesian oval (for a fuller explanation of this concept, see, for example: O. N. Stravoudis. "The Optics of Rays, Wavefronts and Caustics". Academic Press, London 1972). In this case the surface given by equation (8) use to be a closed surface, so that the straight lines on which the rays rest cut this surface at least twice. They are Cartesian oval points the points of the surface given equation (8) for which the ray coming from point 7 forms with the normal to the surface (at that point) an angle whose cosine has the same sign as the cosine of the angle formed by that normal with the ray that goes to point 8.

Figure 7:
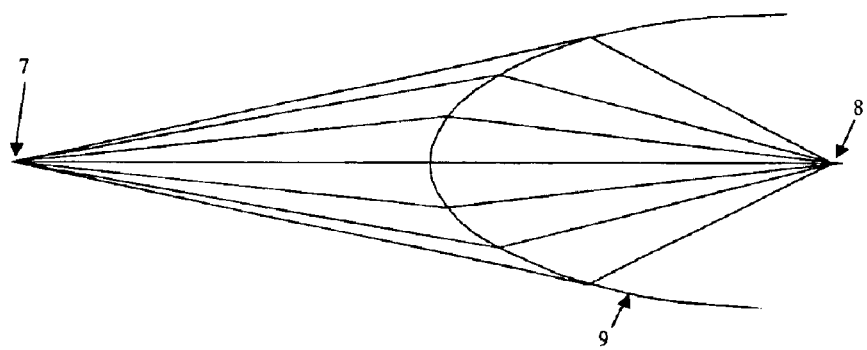
FIG. 7 is a scheme of Cartesian oval of reflection when there are no optical elements between the oval and point 7 and point 8.

FIG. 7 is a diagram showing a Cartesian oval line of refraction in the case where there are no optical elements between the oval line and the points 7 and 8.

The points of the surface in the Cartesian oval line 9 are a subset of the points given by the equation (8).

Figure 8:
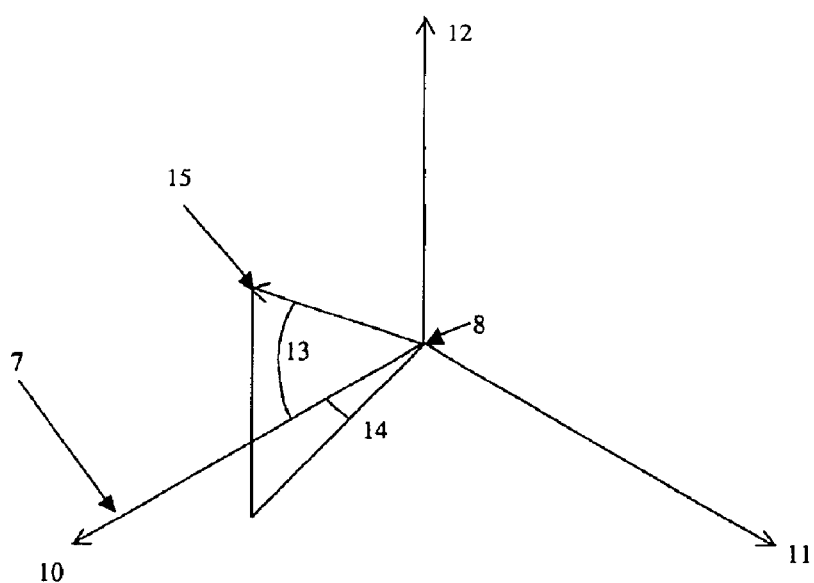
FIG. 8 is a diagram of system of coordinates x, y, z given by Cartesian axis 10, 11 and 12.

FIG. 8 is a diagram showing the coordinate system x, y and z given by the orthogonal axes 10, 11 and 12.

Any point 15 of the surface of the oval line that focuses the rays of point 7 on the point 8 can be defined by the angles 13 $\theta$ and 14 $\phi$. The plane tangent to the oval line that passes through a predetermined point is also univocally defined by angles 13 and 14. Now assume that this plane is a refractive (reflective) surface. By using ray tracing we can identify the area of this plane through which rays emitted from 7 and eventually reaching the active area of the diffuser. This area is referred to as an active area corresponding to planes 13 and 14. The procedure for calculating the faces of the polyhedral surface that form the lens will be described below:

1. Calculate the active area that corresponds to a plane with a given direction, for example, that corresponding to the angle 13=0. The polyhedron is now formed by a single plane. Establish the value of the variable i=0.
2. Increase i by one unit.
3. Next, increase angle 13 by a small value (for instance $\pi/20$) and choose the number n of faces that will be the number of faces of the row i. These faces will be tangent to the oval at points of the oval that have an angle 13 equal to the value just increased, which will be called $\theta_i$. Choose an arbitrary value $\phi_{0i}$ that lies between 0 and $2\pi/n$.
4. Calculate the active areas corresponding to the values of the angle 13=$\theta_i$ and angle 14=$\phi_{ci}$+j$2\pi/n$ where j=0, 1, . . . , n-1.
5. Calculate the polyhedron Pi formed by the faces contained in the planes corresponding to the angle 13=$\phi_i$ and angle 14=$\phi_{0i}$+j$2\pi/n$ where j=0, 1, . . . , n-1.
6. If the active areas calculated in step 4 are not contained in the surface of the polyhedron, return to step 3 and take a smaller integer value for n until achieving that these active areas are contained in the polyhedron $P_i$. In order to achieve greater efficiency of the lens (or mirror) it is desirable that the active areas are tangent to the sides of the polyhedron, or that they approximate to this situation.
7. Form the polyhedron $T_I$ with all the faces calculated up to now. If the active areas calculated in step 4 are not contained in the surface of the polyhedron $T_I$, return to step 3 and take a lower value for the increase of angle 13 or modify the value of $\phi_{0i}$ until achieving that these active areas are contained in the polyhedron $T_I$. In order to achieve greater efficiency of the lens (or mirror) it is desirable that the active areas are tangent to the sides of the polyhedron, or that they approximate to this situation.
8. Go to step 2 until either the surface of the polyhedron $T_I$ intercepts the majority (80% or more) of the power emitted by the laser bundle, or until no further advance can be made because on increasing angle 13 in step 3, points are obtained that do not belong to the Cartesian oval.
9. Calculate by ray tracing the irradiance produced by the laser and the lens on the active surface of the diffuser and the efficiency of the polyhedral surface (power collected on the active surface of the diffuser divided by power emitted by the laser), without taking into account interference effects.
10. If the uniformity of the irradiance in the active area is not sufficient, make a new design situating the diffuser or the laser further away from the Cartesian oval. If the efficiency is insufficient, choose values greater than n or lower values for the increase of angle 13 in step 3. In general, it is not possible to achieve efficiencies of 100% or absolutely uniform irradiances, and a compromise solution must be reached. Finally, it is possible to discard some of the designed faces either because they are inconvenient from a mechanical point of view or because their contribution to uniformity and efficiency is not particularly significant. After this discarding it is advisable to make a new analysis.

Figure 9:
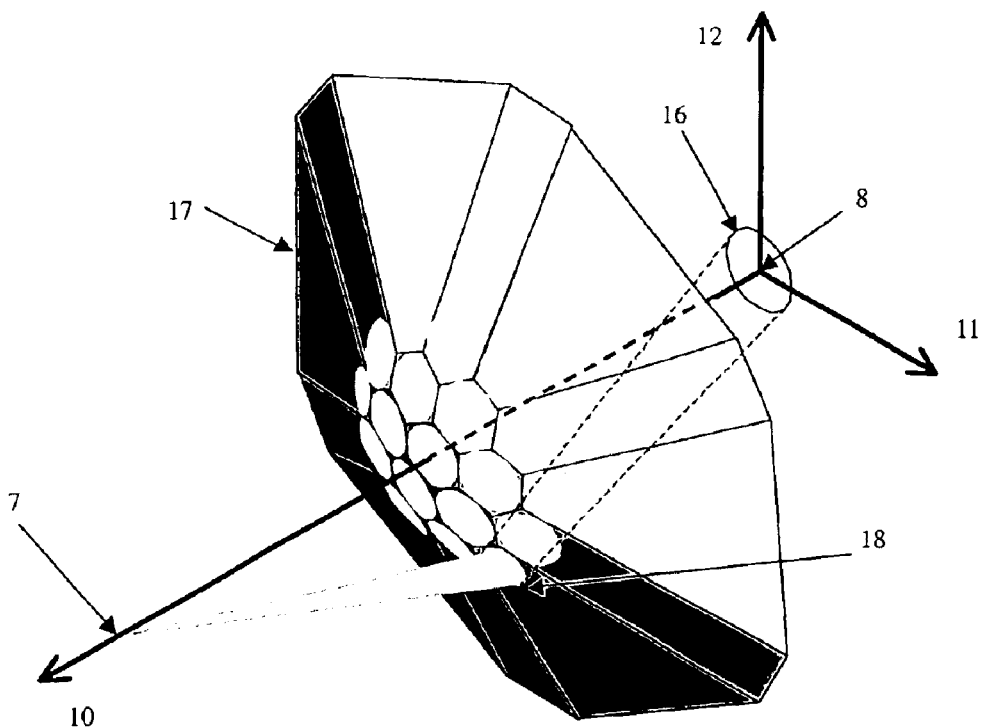
FIG. 9 is a diagram of polyhedral lens on completing the iteration i=2.

FIG. 9 is a diagram showing a constitution of a polyhedral lens on completing the iteration i=2.

The refractive surface of the lens 17 delimits the region of high refractive index, which corresponds to low values of the axis x10 of the region of low refractive index, which corresponds to high values. This surface is formed of flat faces. FIG. 9 also shows the active area 18 of each face, which looks oval. This is the area of the flat face through which pass rays coming from point 7 that will fall into the active area of the diffuser 16.

Figure 10:
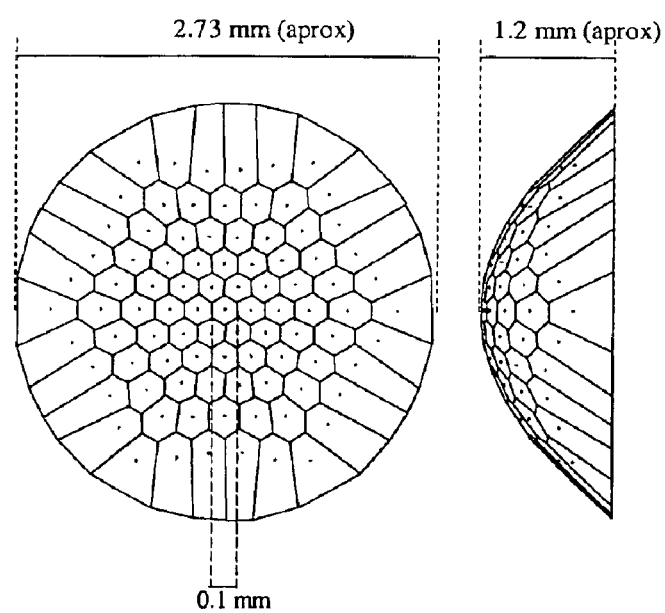
FIG. 10 is a diagram of polyhedral lens in which the x coordinate (axis 10) of point 7 is 8 mm and the value of L in equation 8 is L=11.16 mm.

FIG. 10 is a diagram showing an actual constitution of polyhedral lens in the case where the x axis (axis 10) of the point 7 is 8 mm, and the value of L in the equation (8) is L=11.16 mm.

The refractive index of the lens is 1.48.

Figure 11:
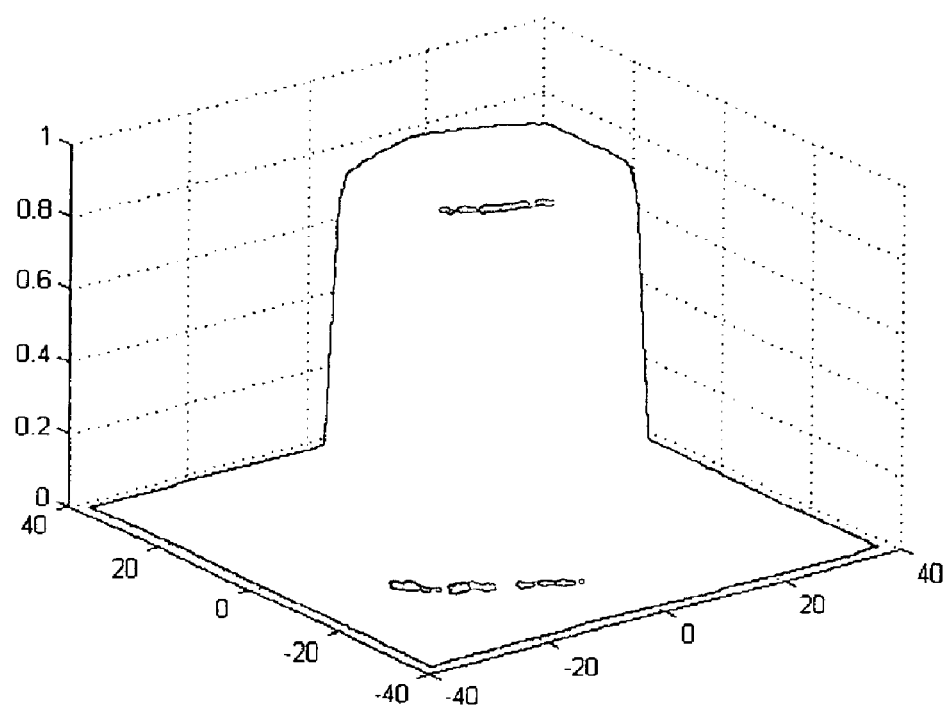
FIG. 11 is a schematic graph displaying the result of calculation of the irradiance obtained in the plane of the diffuser (in arbitrary units), obtained through ray tracing.

FIG. 11 is a diagram showing the results of calculating the irradiance obtained in the plane of the diffuser (in arbitrary units), obtained through ray tracing without taking into account interference effects.

It is not necessary to begin with the plane corresponding to angle 13=0 (step 1). The design can also be carried out limiting step 1 to establishing i=0.

The above procedure is valid for both polyhedral lenses and mirrors. When the focusing system of the laser bundle is made up of an optical system that contains at least one polyhedral surface that works by reflection or by refraction, then it is possible to achieve uniformity of irradiance on the surface of the diffuser.

Figure 12:
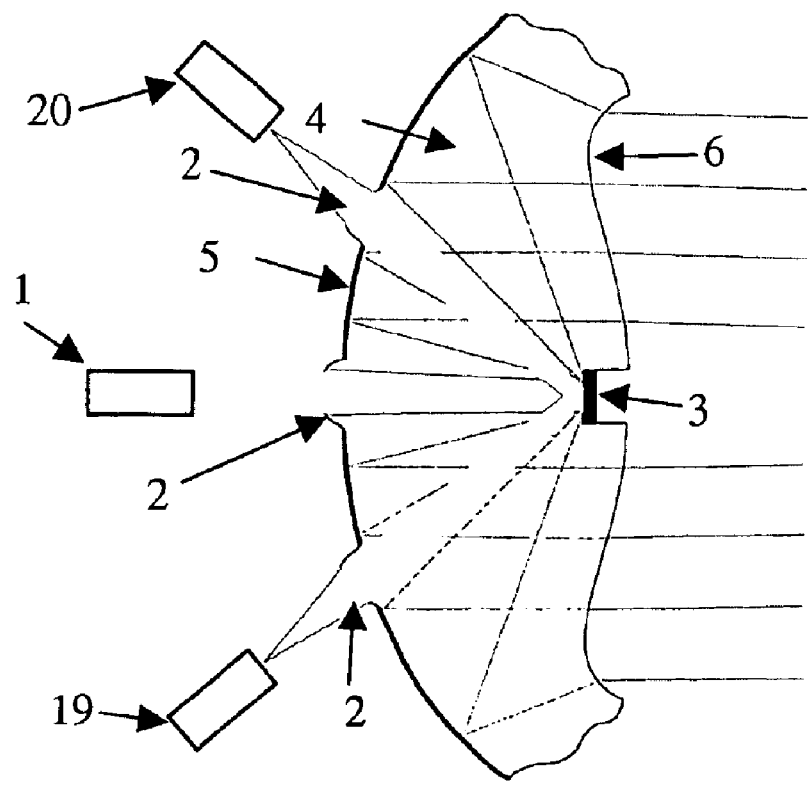
FIG. 12 is a diagram of another example of the light source device containing various laser devices with different wavelengths.

FIG. 12 is a diagram showing a concrete example of a light source device including several laser light source having different wavelengths focused on the same area of the diffuser, in such a way that the radiation diffused and the radiation emitted by the collimation optical system are those of the color resulting from the mixing of the radiations of the different lasers.

The light source device comprises three laser devices having different wavelengths 1, 19 and 20, focusing the laser bundle emitted by the devices on reflective diffuser 3 through 23 focusing system 2.

The interest of this application is in the field of illumination. By means of the different lasers it is possible to achieve, for example, the color white, and through appropriate design it is possible to achieve that its radiation is safe for the human eye. Laser devices, as against LED devices, present the advantage of greater efficiency in the conversion of electrical energy into light energy, although at present their cost is far higher.

Sometimes it is interesting to utilize a device that makes use of a diaphragm for delimiting the area of the diffuser that emits radiation towards the collimator. This diaphragm may define a circular outline of an outline of any other type, and mayor may not have a variable aperture. If the optical system of collimation is such that the diffuser is situated in its focal plane, then the angular field of emission of the laser radiation diffused will also be delimited through the use of a diaphragm. If, moreover, the aperture of this diaphragm is variable, it is possible to vary the angular field of emission accordingly.

In addition to polyhedral lenses, there exists at least one other simple possibility for improving the uniformity of the irradiance emitted by the diffuser. This possibility consists in the use of concave surfaces such that the incident laser radiation undergoes several diffuse reflections before leaving the diffuser and moving towards the collimator. This is the principle of the integrating sphere or Helmholtz sphere (for more information on this concept, see, for example, J. C. Miñano "Optical confinement in Photovoltaics" in Physical Limitations to Photovoltaic Energy Conversion". A. Luque, G. L. Araujo (Editors). Adam Hilger, Bristol 1990).

Figure 13:
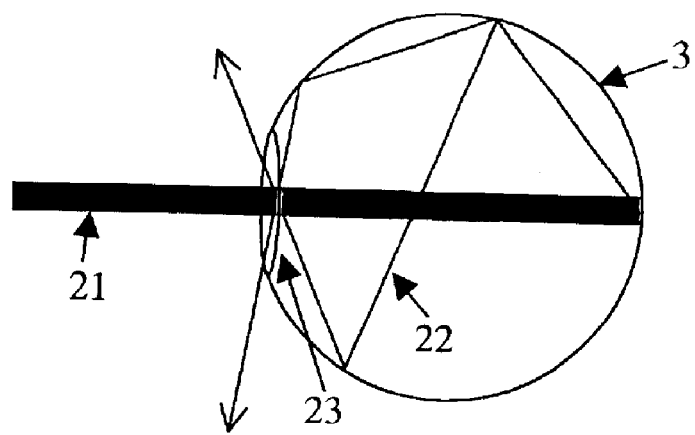
FIG. 13 is a diagram showing a function of the integrating sphere acting as a diffusing element.

FIG. 13 is a diagram showing a function of the integrating sphere acting as a diffusing element.

The sphere is coated in its interior with diffusive reflective material (for example, white paint), and has an aperture through which radiation enters and exits. The incident laser radiation 21 is reflected in the interior of the sphere. Part of this reflected diffuse radiation 22 is reflected again in the interior of the sphere, so that the radiation that leaves through the aperture 23 improves the uniformity of irradiance with respect to the case in which the sphere is not used. In order to achieve that the irradiance on exit from the diffuser is uniform, it is enough for the surface to be concave. This idea is also applicable to transmissive diffusers. In the transmissive diffuser there is, in general a part of the radiation that it is reflected. This part is lost in a flat diffuser but it can be used to increase uniformity in a concave transmissive diffuser. When the surface of the diffuser is a concave surface, as seen from the incident laser beam, some increase in uniformity is achieved with respect to the case in which the surface is flat or convex. The increase is higher the greater the ratio between the area of the diffuser and the area of its aperture.

Figure 14:
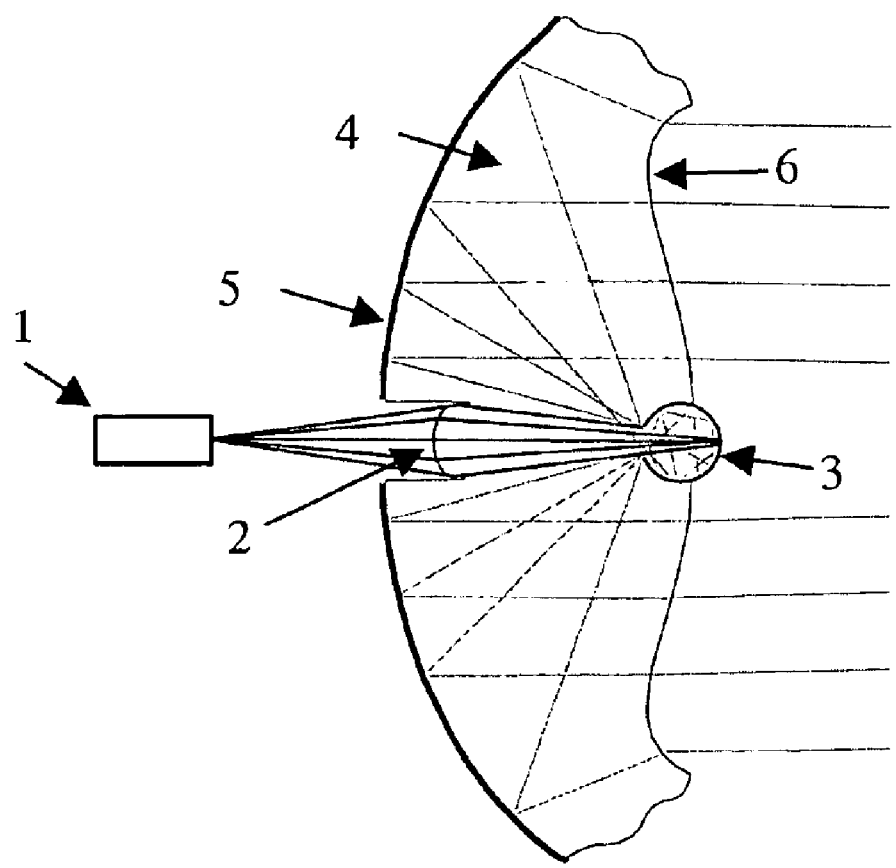
FIG. 14 is a diagram of another example of the light source device employing a concave reflective diffuser surface.

FIG. 14 is a diagram showing a concrete example of a light source device employing a concave reflective diffuser surface.

This light source device employs an integrating sphere as the concave reflective diffuser 3 in the light source device shown in FIG. 4.

In all of the previous cases the diffuser can be substituted by a set of microlenses or micromirrors. If the focal distance of each one of these microlenses or micromirrors is small compared to the maximum diameter of the active area of the diffuser, then an effect similar to that of the diffuser can be achieved. However, it should be noted that the treatment given by the regulations CENELEC EN 60825-1, CENELEC EN 60825-2 (CEI825-2:1993), JISC6802:1997 and IEC60825-2:1993 to this case is different from that given to the case in which a diffuser is used, and that, in general, it is not as beneficial from the point of view of improving safety for the human eye, unless the number of microlenses or micromirrors is very large, that is, when each one of these microlenses or micromirrors intercepts a small fraction of the power transported by the incident laser bundle. When the diffuser is substituted by a set of microlenses or micromirrors in such a way that each one of these microlenses or micromirrors intercepts a fraction not exceeding 10% of the power emitted by the laser bundle it is achieved that the power of the laser bundle that must be considered in the regulations cited above is reduced.

Figure 15:
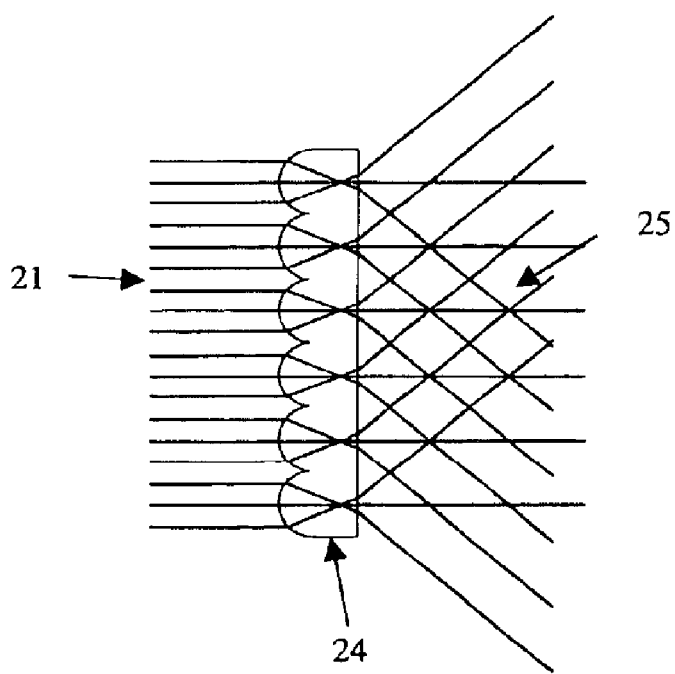
FIG. 15 is a diagram of another example of the light source device employing a set of microlenses instead of a transmissive diffuser.

FIG. 15 is a diagram showing a concrete example of a light source device employing a set of microlenses instead of a transmissive diffuser.

The light source device comprises a set of microlenses 24.

The laser radiation 21 impinges on the set of microlenses 24 with short focal distance. On leaving the microlenses the radiation 25 has greater angular dispersion. This radiation is directed towards the collimator.

When the focal plane of the microlenses or micromirrors coincides with the focal plane of the collimator, the object of the present invention can be used as an emitting source for multi-spot configurations in wireless optical communications (these configurations are described, for example, in S. Jivkova and M. Kavehrad, "Multi-spot diffusing configuration for wireless infrared access; joint optimization of multibeam transmitter and angle diversity receiver", in Optical Wireless Communications II, Eric Korevaar, Editor, Proceedings of SP1E Vol. 3850, pp 72–79), since the effect it has is to separate the incident laser in to several laser bundles of lower intensity (as many as there are illuminated microlenses or micromirrors).

Another way of achieving a spectral composition on exit different from the spectral composition of the entry laser bundle is to use phosphorescent or fluorescent materials that absorb the incident radiation and reemit it at other wavelengths. When the diffuser is formed of a florescent or phosphorescent material that reemits in diffuse form incident laser radiation, and which also modifies its spectral composition, then the radiation that illuminates the collimator, and therefore that which leaves the device that is the object of this invention, has a different spectral composition from that of the incident laser. In this way it is possible, for example, to achieve that the object of this invention emits white light when the laser emits monochromatic (blue or ultra-violet) radiation.

The optical system that is the object of the invention can be manufactured by turning on a diamond-tip lathe with numerical control (CNC) using a plastic material such as PMMA. The reflective diffuser can be manufactured by coating a white color coating on the substrate, the transmissive diffuser can be manufactured by treating the surface chemically or mechanically (for example, with an abrasive and the like), or by adding spherical transparent material in a size of several—several tens of $\mu$m, that is, by employing a transparent substrate having a matt finish surface (for example, glass or PMMA).

The invention presented here has direct application in a variety of fields. In general, it can be used as a laser radiation emitting system in all applications in which the laser device produces irradiance greater than desired, so that it is necessary to reduce it without having to renounce the collimation of the bundle. In particular, it can be used as a commuted laser radiation source in a wireless optical communication system, or as a source of continuous radiation for illumination (both within the visible spectrum and outside of it), as well as in medical applications.

As described above, according to the present invention, a light source device which employs a laser diode as a light source is safe for human eyes, and its switching is performed at high speed can be provided. This light source device is preferably used for a wireless optical communication.

1. Laser device
2. Optical device for focussing the laser beam on the diffuser
3. Diffuser
4. Optical device for collimating the diffused beam
5. Reflector
6. Refractive surface
7. Laser beam waist
8. Diffuser central point
9. Cartesian oval surface
10. x axis
11. y axis
12. z axis
13. angle θ
14. angle φ
15. A point of the oval
16. Diffuser active region
17. Polyhedral lens
18. Active region of a face of the polyhedron
19. Laser device emitting radiation of wavelength $\lambda_2$.
20. Laser device emitting radiation of wavelength $\lambda_3$.
21. Laser beam
22. Reflected diffuse radiation
23. Diffuser aperture
24. Microlens array
25. Radiation exiting the microlens array

What is claimed is:

1. A light source device comprising:

a laser light source;

a diffuser that is at least partially reflective and arranged to have incident thereon light emitted from said laser light source;

a collimator for collimating a light that has been reflected and diffused by said diffuser and emitting the collimated light, and an optical focusing system arranged to focus the light emitted from said laser onto said diffuser, wherein said diffuser, said collimator and said optical focusing system are formed on a single solid piece.

2. The light source device according to claim 1, wherein one portion of one surface of the single solid piece is coated by a mirror surface, and said diffuser is mounted on another portion of said surface.

3. A light source device comprising:

a laser light source;

a diffuser arranged to diffuse light emitted from said laser light source;

an optical focusing system arranged to focus light emitted by said laser onto said diffuser, and a collimator for collimating said light diffused by said diffuser and emitting the collimated light, wherein said diffuser, said collimator and said optical focusing system are formed on a single solid piece, one portion of a contoured surface of said single solid piece is coated by a mirror surface, and said diffuser is mounted on another portion of said contoured surface.

4. A light source device comprising:

a laser light source;

a diffuser arranged to diffuse light emitted from said laser light source;

an optical focusing system arranged to focus light emitted by said laser onto said diffuser; and a collimator for collimating a light diffused by said diffuser and emitting the light, wherein said diffuser, said collimator and said optical focusing system are formed on a single solid piece.

* * * * *